(12) United States Patent
Sato

(10) Patent No.: US 10,043,673 B2
(45) Date of Patent: Aug. 7, 2018

(54) FINAL POLISHING METHOD OF SILICON WAFER AND SILICON WAFER

(71) Applicant: SHIN-ETSU HANDOTAI CO., LTD., Tokyo (JP)

(72) Inventor: Michito Sato, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/328,699

(22) PCT Filed: Jul. 13, 2015

(86) PCT No.: PCT/JP2015/003522
§ 371 (c)(1),
(2) Date: Jan. 24, 2017

(87) PCT Pub. No.: WO2016/021117
PCT Pub. Date: Feb. 11, 2016

(65) Prior Publication Data
US 2017/0213742 A1    Jul. 27, 2017

(30) Foreign Application Priority Data
Aug. 5, 2014 (JP) .................................. 2014-159737

(51) Int. Cl.
*H01L 21/306* (2006.01)
*B24B 37/24* (2012.01)
(Continued)

(52) U.S. Cl.
CPC ........ *H01L 21/30625* (2013.01); *B24B 37/24* (2013.01); *B24B 57/02* (2013.01); *C09G 1/02* (2013.01); *C09K 3/1409* (2013.01)

(58) Field of Classification Search
CPC ... H01L 21/30625; C09G 1/02; C09K 3/1409; B24B 57/02
See application file for complete search history.

(56) References Cited

U.S. PATENT DOCUMENTS

2002/0016139 A1* 2/2002 Hirokawa ............... B24B 37/24
                                                        451/54
2008/0053001 A1    3/2008 Noguchi et al.
(Continued)

FOREIGN PATENT DOCUMENTS

JP    2008-053414 A    3/2008
JP    2008-168380 A    7/2008
(Continued)

OTHER PUBLICATIONS

Sep. 15, 2015, Search Report issued in International Patent Application No. PCT/JP2015/003522.
(Continued)

*Primary Examiner* — Duy Vu N Deo
(74) *Attorney, Agent, or Firm* — Oliff PLC

(57) ABSTRACT

A final polishing method using a polishing agent that contains colloidal silica, ammonia, and hydroxyethyl cellulose in which the colloidal silica has a primary particle size of 20 nm or more and less than 30 nm, the hydroxyethyl cellulose has a weight average molecular weight of 400,000 to 700,000, and the polishing agent satisfies $1.5 \leq D_1/D_2 \leq 2.5$ where $D_1$ is a particle size having a cumulative volume percentage of 95% of particles contained in the polishing agent, and $D_2$ is a particle size having a cumulative volume percentage of 95% of the colloidal silica in case of dispersing the colloidal silica in water with a concentration identical to a colloidal silica concentration in the polishing agent, and using a polishing pad that exhibits a contact angle of 60° or more 100 seconds after dropping pure water to the polishing pad that has been subjected to seasoning and then dried.

2 Claims, 4 Drawing Sheets

(51) Int. Cl.
*B24B 57/02* (2006.01)
*C09G 1/02* (2006.01)
*C09K 3/14* (2006.01)

(56) References Cited

U.S. PATENT DOCUMENTS

| | | |
|---|---|---|
| 2010/0090314 A1 | 4/2010 | Iizuka et al. |
| 2013/0302984 A1 | 11/2013 | Tsuchiya et al. |
| 2015/0056122 A1 | 2/2015 | Takahashi et al. |
| 2015/0166838 A1* | 6/2015 | Tsuchiya ........... H01L 21/02024 423/348 |

FOREIGN PATENT DOCUMENTS

| | | |
|---|---|---|
| JP | 2014-118490 A | 6/2014 |
| TW | I414012 B | 11/2013 |
| WO | 2012/102144 A1 | 8/2012 |
| WO | 2013/108770 A1 | 7/2013 |
| WO | 2013/108777 A1 | 7/2013 |

OTHER PUBLICATIONS

Jan. 17, 2017 Office Action issued in Japanese Patent Application No. 2014-159737.
Mar. 28, 2017 Office Action issued in Tawiwanese Patent Application No. 104122995.

* cited by examiner

| | Polishing pad A-1 | Polishing pad A-2 | Polishing pad A-3 | Polishing pad B | Polishing pad C | Polishing pad D | Polishing pad E |
|---|---|---|---|---|---|---|---|
| Hardness (Shore A) | 56 | 56 | 56 | 50 | 45 | 62 | 54 |
| Seasoning time | 30 min | 120 min | 240 min | 30 min | 30 min | 30 min | 30 min |
| Contact angle after 100 sec [°] | 0.0 | 53.5 | 62.8 | 40.8 | 63.9 | 81.9 | 114.5 |
| Photograph of droplet after 100 sec |  |  |  |  |  |  |  |

& 1

FINAL POLISHING METHOD OF SILICON WAFER AND SILICON WAFER

TECHNICAL FIELD

The present invention relates to a final polishing method of a silicon wafer and to a silicon wafer.

BACKGROUND ART

A semiconductor wafer typified by a silicon wafer is polished with a polishing apparatus 601, as shown in FIG. 6, including a turn table 603 with a polishing pad 602 attached, a polishing-agent-supply mechanism 604, and a polishing head 606 by holding the semiconductor wafer W with the polishing head 606, supplying a polishing agent 605 from the polishing-agent-supply mechanism 604 to the polishing pad 602, separately rotating the turn table 603 and the polishing head 606, and bringing the surface of the semiconductor wafer W into sliding contact with the polishing pad 602.

The semiconductor wafer is often polished in multiple stages with changing the kinds of the polishing pad and the polishing agent; first double-side polishing is referred to as primary polishing, polishing after the primary polishing is referred to as secondary polishing, and a polishing process in the final stage is referred to as finish polishing or final polishing.

In the final polishing process, single-side polishing is often employed, and the polishing agent and the polishing pad are selected so as to reduce surface defects and surface roughness of a wafer, called haze. The materials typically used are an alkali-based polishing agent containing colloidal silica and a suede type of polishing pad. Since a polished wafer has a hydrophobic surface, foreign substances are attached to the surface, and the surface is non-uniformly etched by alkali in the polishing agent, which causes haze unevenness. It has thus been known that a water-soluble cellulose such as hydroxyethyl cellulose is added to the polishing agent to make the surface of the polished wafer hydrophilic and inhibit attachment of foreign substances and etching unevenness on the surface.

With respect to the haze of a wafer, addition of hydroxyethyl cellulose (HEC) to the polishing agent has been known to more significantly reduce a haze level than addition of other cellulose (See Patent Document 1, for example). However, hydroxyethyl cellulose, which is suited to improve hydrophilicity of a wafer, is difficult to be filtered and easy to aggregate, thus disadvantageously increasing micro defects on the wafer surface. To solve this problem, it has been proposed that hydroxyethyl cellulose having a low molecular weight is used to improve the filterability, or an undiluted solution is filtered, and then a diluted solution is filtered again (See Patent Document 2, for example). Moreover, it has been proposed to control the ratio of average secondary particle sizes of abrasive grains before and after dilution (See Patent Document 3, for example).

CITATION LIST

Patent Literature

Patent Document 1: Japanese Unexamined Patent publication (Kokai) No. 2008-053414
Patent Document 2: WO2013/108777
Patent Document 3: WO2013/108770

SUMMARY OF INVENTION

Technical Problem

Besides, the wafer surface has been recently required to improve its smoothness. To improve the wafer surface roughness (haze), brush cleaning with low etching power is introduced for cleaning a polished silicon wafer. The brush cleaning enables cleaning with a lower etching amount than batch cleaning using a chemical solution, typified by SC1 (a mixed solution of ammonia and hydrogen peroxide water) cleaning. Thus, the brush cleaning can inhibit haze degradation on the wafer surface due to etching.

The haze of a silicon wafer is measured by a laser scattering type of wafer surface inspection apparatus (e.g., Surfscan SP3, made by KLA-Tencor Corp.), and an average value of the wafer entire surface is generally used as a central value of the wafer. The haze level in the plane can also be output as a map. This haze map is used to visually judge a local haze abnormality that cannot be found in the average value.

The haze map is usually output by auto scaling in many cases. Thus, along with improvement of the haze level, haze unevenness can be easily observed, and haze unevenness that occurs in an outer circumferential portion is especially becoming a problem. FIG. 7 shows an exemplary haze map. FIG. 8 shows an example of the haze unevenness that occurs in an outer circumferential portion.

The haze unevenness in an outer circumferential portion is remarkably caused when the polishing pad has a low polishing-agent-holding property, especially at an early stage of a lifetime of the polishing pad. This problem is met by prolonging a start-up time (seasoning time) of the polishing pad or polishing a dummy wafer. However, the prolonged suspension of a polishing apparatus reduces the productivity, as well as the seasoning and the dummy wafer running increase the start-up cost and reduce the lifetime of the polishing pad.

Moreover, when hydroxyethyl cellulose having a large molecular weight is added to improve hydrophilicity of the wafer surface and inhibit non-uniform etching of the surface due to the polishing agent, surface defects are increased because of the filterability. To improve the surface defects, there have been proposed the method of filtering an undiluted solution and then filtering a diluted solution again (See Patent Document 2) and the method of controlling the ratio of average secondary particle sizes before and after dilution (See Patent Document 3). However, these methods are insufficient to satisfy both conflicting qualities of wafer wettability and micro defect.

The present invention was accomplished in view of the above-described problems. It is an object of the present invention to provide a final polishing method that can provide a silicon wafer having a good haze level as a whole, little haze unevenness in an outer circumferential portion, and few micro defects.

Solution to Problem

To achieve this object, the present invention provides a final polishing method comprising bringing a silicon wafer into sliding contact with a polishing pad attached to a turn table while supplying a polishing agent to the polishing pad, wherein the polishing agent contains colloidal silica, ammonia, and hydroxyethyl cellulose, the colloidal silica has a primary particle size of 20 nm or more and less than 30 nm as measured by BET method, the hydroxyethyl cellulose has a weight average molecular weight of 400,000 to 700,000, the polishing agent satisfies $1.5 \leq D_1/D_2 \leq 2.5$ where $D_1$ is a particle size having a cumulative volume percentage of 95% of particles contained in the polishing agent as measured by dynamic light scattering or laser diffraction scattering, and $D_2$ is a particle size having a cumulative volume percentage of 95% of the colloidal silica in case of dispersing the colloidal silica in water with a concentration identical to a colloidal silica concentration in the polishing agent as measured by dynamic light scattering or laser diffraction scattering, and the polishing pad exhibits a contact angle of 60° or more with pure water, the contact angle being measured 100 seconds after dropping the pure water to the polishing pad that has been subjected to seasoning and then dried.

This final polishing can provide a silicon wafer having a good haze level as a whole, little haze unevenness in an outer circumferential portion, and few micro defects.

A time of the seasoning may be 30 minutes.

When the seasoning time is 30 minutes, the productivity is not much reduced due to suspension of polishing by a polishing apparatus even if the seasoning is performed with, for example, the polishing apparatus itself. Moreover, when the seasoning is performed with a polishing agent, the seasoning for 30 minutes can reduce the cost of the polishing agent and inhibit reduction of the lifetime of the polishing pad due to clogging of the polishing pad.

Furthermore, to achieve the above object, the present invention provides a silicon wafer polished by the inventive final polishing method.

In this manner, the inventive final polishing method can provide a semiconductor wafer having a good haze level as a whole, little haze unevenness in an outer circumferential portion, meeting the recent requirement for smoothness of the wafer surface, and having few micro defects.

Advantageous Effects of Invention

The final polishing according to the invention can provide a silicon wafer having a good haze level as a whole, little haze unevenness in an outer circumferential portion, and few micro defects.

DESCRIPTION OF EMBODIMENTS

Hereinafter, embodiments of the present invention will be described, but the present invention is not limited thereto. First, a polishing apparatus usable in the final polishing method according to the invention will be described with reference to FIG. 1.

Figure 1:
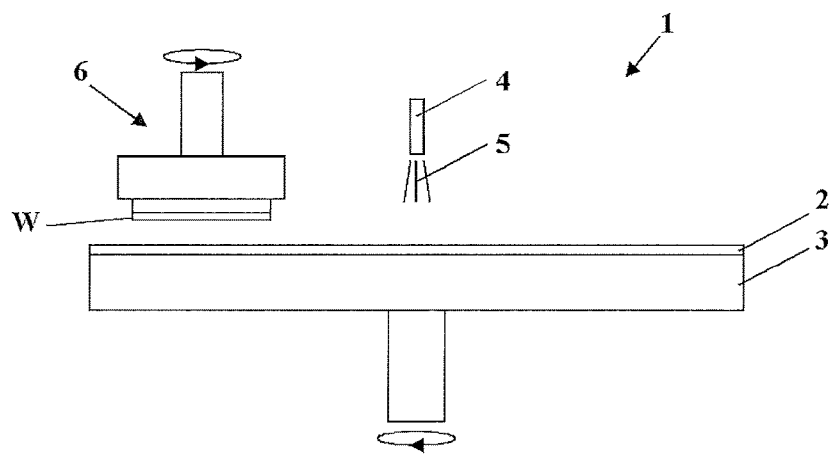
FIG. 1 is a schematic diagram showing an example of a single-side polishing apparatus usable in the final polishing method according to the invention.

The polishing apparatus 1 shown in FIG. 1 is mainly including a turn table 3 with a polishing pad 2 attached, a polishing-agent-supply mechanism 4, and a polishing head 6. The polishing apparatus 1 is used for polishing by holding a silicon wafer W with the polishing head 6, supplying a polishing agent 5 from the polishing-agent-supply mechanism 4 to the polishing pad 2, separately rotating the turn table 3 and the polishing head 6, and bringing the surface of the silicon wafer W into sliding contact with the polishing pad 2.

The inventive final polishing method using the polishing apparatus 1 to polish a silicon wafer will now be described.

In the inventive final polishing method, a solution containing colloidal silica, ammonia, and hydroxyethyl cellulose is used as the polishing agent 5. In this polishing agent, the colloidal silica has a primary particle size of 20 nm or more and less than 30 nm as measured by BET method, and the hydroxyethyl cellulose has a weight average molecular weight of 400,000 to 700,000. Moreover, the polishing agent satisfies $1.5 \leq D_1/D_2 \leq 2.5$ where $D_1$ is a particle size having a cumulative volume percentage of 95% of particles contained in the polishing agent as measured by dynamic light scattering or laser diffraction scattering, and $D_2$ is a particle size having a cumulative volume percentage of 95% of the colloidal silica in case of dispersing the colloidal silica in water with a concentration identical to a colloidal silica concentration in the polishing agent as measured by dynamic light scattering or laser diffraction scattering.

In general, a polishing agent containing a water-soluble polymer such as hydroxyethyl cellulose causes abrasive grains (colloidal silica) to aggregate with the water-soluble polymer, and thus tends to have a large abrasive grain size, compared with a polishing agent containing no water-soluble polymer. The present inventor found that the aggregation effect of the water-soluble polymer can be evaluated by $D_{95}$ (a particle size having a cumulative volume percentage of 95% in particle size distribution on the basis of volume) of particles contained in the polishing agent, as measured by dynamic light scattering or laser diffraction scattering.

More specifically, the aggregation state of abrasive grains attributable to an additive such as the water-soluble polymer contained in the polishing agent can be quantified by calculating the ratio $D_1/D_2$ where $D_1$ is $D_{95}$ of particles present in the polishing agent containing the water-soluble polymer, and $D_2$ is $D_{95}$ of colloidal silica in case of dispersing the colloidal silica in water with a concentration identical to the colloidal silica concentration in the polishing agent. The particles contained in the polishing agent are mainly colloidal silica, and also include, for example, aggregates of hydroxyethyl cellulose and aggregates of other additives. It can be judged that when the ratio $D_1/D_2$ is around 1.0, the abrasive grains are not aggregated; and when the ratio $D_1/D_2$ is larger than 1.0, the aggregation proceeds due to the additive such as the water-soluble polymer contained in the polishing agent. Accordingly, when the ratio $D_1/D_2$ is small, micro defects due to aggregated abrasive grains in the polishing agent can be inhibited. $D_{95}$ can be measured, for example, by a nano-particle size distribution measurement apparatus SALD-7100, made by SHIMADZU Corp.

Moreover, the haze of the wafer surface is also affected by a primary particle size (also referred to as an average primary particle size) calculated on the basis of a specific surface area of the abrasive grains, measured on the colloidal silica (the abrasive grains) by BET method. Under the same polishing load, abrasive grains having a smaller primary particle size can achieve a pressure dispersion effect on the abrasive grains, but abrasive grains having a primary particle size of less than 20 nm easily aggregate and thus degrade a surface defect level. In addition, such particles reduce a polishing rate, thus decreasing the productivity and increasing the cost. Meanwhile, abrasive grains having a primary particle size of 30 nm or more have an insufficient pressure dispersion effect and thus degrade the haze. Therefore, the abrasive grains should have an average primary particle size of 20 nm or more and less than 30 nm, in view of a balance between the wafer haze level, surface defect level, and polishing rate.

The hydrophilicity (wettability) of the wafer surface is largely affected by the weight average molecular weight of hydroxyethyl cellulose. A larger weight average molecular weight can reduce the haze unevenness but increase the ratio $D_1/D_2$ and increase micro defects due to agglomerated abrasive grains. Moreover, when the concentration of added hydroxyethyl cellulose is decreased, or a dispersing agent is added in order to decrease $D_1/D_2$, a sufficient hydrophilic effect cannot be obtained although $D_1/D_2$ can be decreased. Therefore, to achieve the hydrophilicity of the wafer surface and inhibit micro defects, the hydroxyethyl cellulose should have a weight average molecular weight of 400,000 to 700,000 as well as the ratio $D_1/D_2$ ranges from 1.5 to 2.5. In particular, the ratio $D_1/D_2$ is preferably 2.3 or less.

Use of such a polishing agent enables inhibition of the haze unevenness and reduction of micro defects caused in final polishing of a silicon wafer.

Furthermore, the present invention uses the polishing pad 2 exhibiting a contact angle of 60° or more with pure water when the contact angle is measured 100 seconds after dropping the pure water to the polishing pad that has been subjected to seasoning and then completely dried. The seasoning means a start-up operation of a polishing pad for smoothing the surface of a new polishing pad just after exchange, generally with ceramics or dummy wafers. This operation is performed with pure water or a polishing agent. The seasoning often takes a long time, and polishing requires suspending during the seasoning, which leads to reduction in productivity of semiconductor wafers. Moreover, the seasoning using a polishing agent increases the cost of the polishing agent and affects the lifetime of the polishing pad. Thus, the seasoning is desirably completed in a short time.

The haze unevenness in an outer circumferential portion of a wafer observed in the haze map is remarkably caused when the polishing pad has a low polishing-agent-holding property, especially at an early stage of the lifetime of the polishing pad. This indicates that the haze unevenness is also affected by the polishing-agent-holding property of the polishing pad. The polishing-agent-holding property of the polishing pad at the early stage of the lifetime can be evaluated by a contact angle at a certain period after dropping pure water to the polishing pad. The pure water dropped to the polishing pad permeates into the polishing pad with the passage of time, and accordingly changes its contact angle. A polishing pad having a good polishing-agent-holding property can be defined as a polishing pad that exhibits a large contact angle and shows little change of the contact angle over time. Therefore, the present invention uses the polishing pad that exhibits a contact angle of 60° or more 100 seconds after dropping pure water and has a good polishing-agent-holding property, whereby a silicon wafer can be polished with little haze unevenness even at an early stage of the lifetime of the polishing pad.

Figure 2:
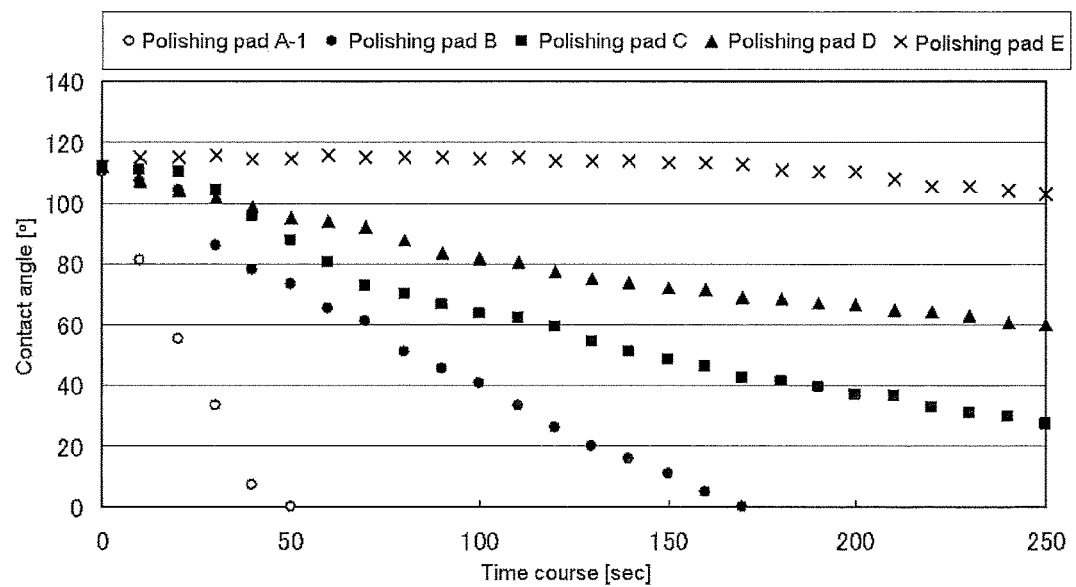
FIG. 2 is a diagram showing change over time of the contact angle of pure water with the polishing pad.

FIG. 2 shows measurement results of change over time of the contact angle when suede type of polishing pads A-1, B, C, D, and E were subjected to seasoning for 30 minutes. The seasoning made surfaces of the polishing pads almost identical without variation depending on the individual polishing pads. Thus, their contact angles just after dropping pure water were almost the same. On the other hand, change over time of the contact angle varied according to the polishing pads.

Figure 3:
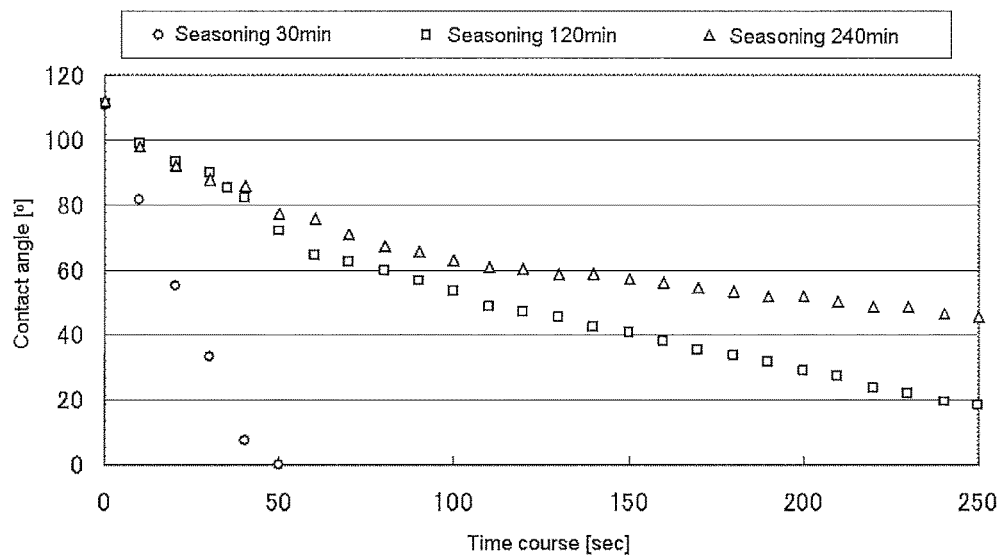
FIG. 3 is a diagram showing change over time of the contact angle, depending on difference in the seasoning time.
Figure 4:
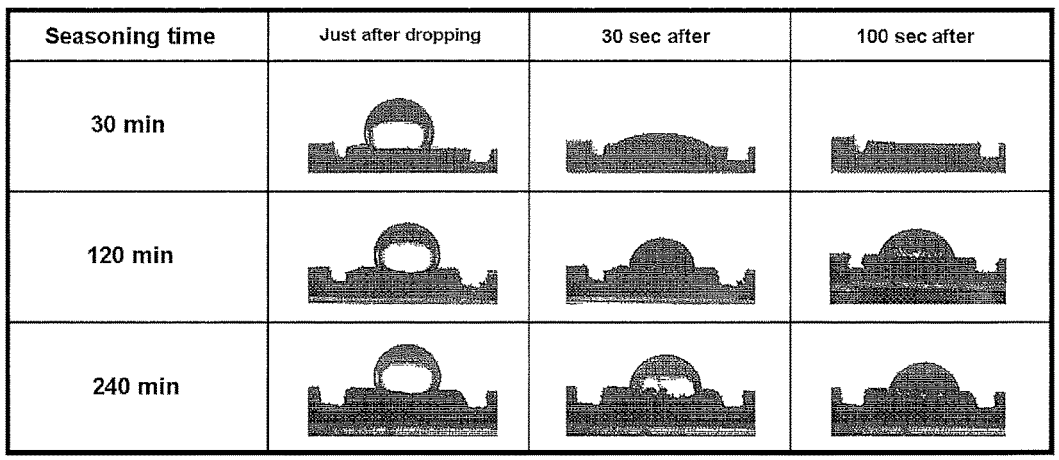
FIG. 4 is a photograph showing change over time of the contact angle, depending on difference in the seasoning time.
Figure 5:
FIG. 5 is a diagram showing the contact angle 100 seconds after dropping pure water to the polishing pad.
Figure 5:
Figure 5:
Figure 5:
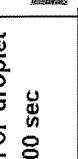
Figure 5:
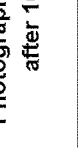
Figure 5:
Figure 5:
Figure 6:
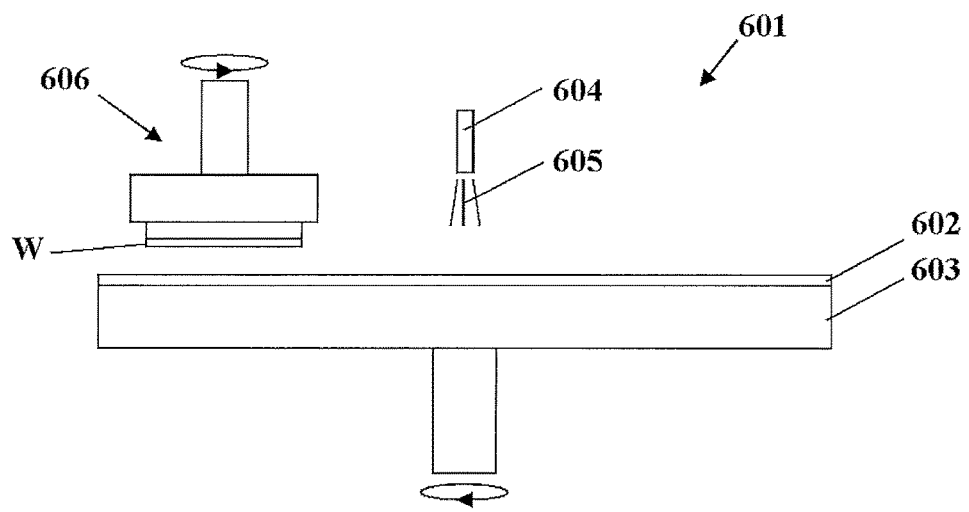
FIG. 6 is a schematic diagram showing an example of a conventional single-side polishing apparatus.

FIG. 3 shows change over time of the contact angle when the seasoning time was changed to 30 minutes (polishing pad A-1), 120 minutes (polishing pad A-2), and 240 minutes (polishing pad A-3) while the same polishing pad was used. This figure shows that although the contact angles just after dropping pure water were almost the same, change over time of the contact angles varied according to the seasoning time, in spite of the same polishing pad. FIG. 4 shows an exemplary state of the droplet at this time. Moreover, FIG. 5 shows contact angles 100 seconds after dropping pure water to the polishing pads A-1, A-2, A-3, B, C, D, and E.

In a polishing pad manufacturing process, an additive such as a surfactant is used as a foam stabilizer. The additive varies in kind and amount to be added according to a maker and the kind of the polishing pad. The additive cannot be completely removed during the polishing pad manufacturing process, and partially remains in the polishing pad, which causes different change over time of the contact angle according to polishing pads. In addition, since the remaining additive is gradually lost through seasoning, the same polishing pad has different concentrations of the remaining additive before and after the seasoning, which leads to change of the contact angle over time.

In particular, the seasoning for 30 minutes with a suede type of final polishing pad, which is usually used for finish polishing, can sufficiently smooth a minute unevenness on the surface of the polishing pad, thus enabling stable evaluation of the contact angle. Moreover, a hydrophilic additive, which largely affects the contact angle, can reduce its residual concentration at a relatively high rate, and thus allows measurement of the contact angle while eliminating the effect of the remaining additive to some extent with seasoning for 30 minutes.

As described above, evaluating the wettability of the polishing pad by the contact angel at a certain period after dropping pure water to the surface of the polishing pad is effective in evaluating the polishing-agent-holding property of the polishing pad.

More specifically, when a polishing pad exhibits a contact angle of 60° or more 100 seconds after dropping pure water to the surface of the polishing pad that has been subjected to seasoning for 30 minutes and then completely dried, this polishing pad can be judged to have a sufficient polishing-agent-holding property even at an early stage of the lifetime of the polishing pad. The contact angle can be measured with a usual contact angle meter. As the contact angle meter, for example, a mobile contact angle meter PG-X, made by MATSUBO Corp., can be used.

The seasoning enables the surface to have a contact angle of 60° or more, but the seasoning time may be prolonged depending on the selected polishing pad, which causes reduction in productivity and increase in start-up cost. Therefore, it is preferable to select a polishing pad that exhibits a contact angle of 60° or more after 100 seconds when the seasoning is performed in a short time of about 5 to 120 minutes, particularly preferably 30 minutes.

When such polishing agent and polishing pad are combined for final polishing, occurrence of the haze unevenness of a wafer, especially the haze unevenness in an outer circumference of a wafer, and occurrence of micro defects can be effectively inhibited from an early stage of the lifetime of the polishing pad.

Moreover, a semiconductor wafer final-polished by the above final polishing method has a good haze level as a whole, little haze unevenness in an outer circumferential portion, meets the recent requirement for smoothness of the wafer surface, and has few micro defects.

EXAMPLE

Next, the present invention will be more specifically described with reference to examples and comparative examples, but the present invention is not limited thereto.

Example 1

A silicon wafer was final-polished according to the inventive final polishing method.

Firstly, abrasive grains (colloidal silica having an average primary particle size of 25 nm, as measured by BET method), ammonia, hydroxyethyl cellulose, and pure water were blended to prepare a polishing agent. In example 1, the hydroxyethyl cellulose has a weight average molecular weight of 500,000. The weight average molecular weight of the hydroxyethyl cellulose was calculated by gel permeation chromatography in terms of polyethylene oxide. The ratio $D_1/D_2$ was 1.86.

As the polishing pad, the polishing pad E shown in FIG. 5 was used. The polishing pad E exhibited a contact angle of 114.5° 100 seconds after dropping pure water, as described above. In this example, the seasoning of the polishing pad was performed with a ceramic turn table at the same polishing load and the same rotational speed as in polishing the wafer, although the seasoning conditions are not particularly limited thereto in the present invention. Moreover, the same polishing agent as used in final polishing was used at the same flow rate as in final polishing.

The contact angle 100 seconds after dropping pure water was measured as follows. After completion of the seasoning, the surface of the polishing pad was cleaned with pure water by a brush. The polishing pad was then cut to obtain a sample for measuring the contact angle at a position that does not affect a polishing result of the wafer, and the polishing pad was evaluated with the sample. The sample for measuring the contact angle was left to stand for 24 hours or more to be completely dried after the seasoning. Then, the contact angle was measured with a mobile contact angle meter PG-X, made by MATSUBO Corp.

The polishing was performed under the following conditions: the polishing apparatus was PNX332B, made by Okamoto Corporation; the polished subject was a silicon wafer having a diameter of 300 mm; the polishing load was 150 g/cm²; the rotational speed of the turn table was 30 rpm; the rotational speed of the head was 30 rpm; the flow rate of the polishing agent was 1 L/min. Moreover, all secondary polishing prior to the final polishing was performed under the same condition. The polishing time of the final polishing was adjusted so as to give the same stock removal. The final-polished wafer was cleaned with a brush cleaning apparatus of a single-wafer processing type to adjust etching conditions such that a haze level after cleaning did not exceed 0.08 ppm.

The haze of the final-polished wafer was evaluated with a wafer surface inspection apparatus Surfscan SP3, made by KLA-Tencor Corp. In general, the haze unevenness is visually judged with a haze map output by auto scaling. In this example, however, only the wafer having a haze level of 0.08 ppm or less was used, a threshold was set to obtain a pattern approximate to haze unevenness that can be found in the map, and a proportion of exceeding the threshold (hereinafter, this proportion is referred to as Defect %) was calculated. While the haze maps of FIG. 7 and FIG. 8 were measured except for an area within 2 mm from the outer circumference of the wafer, the haze unevenness in example 1 was quantified by calculation except for an area within 3 mm from the outer circumference of the wafer to establish consistency with a visual judgment.

Figure 7:
FIG. 7 is a photograph showing an exemplary haze map of a wafer after final polishing.
Figure 8:
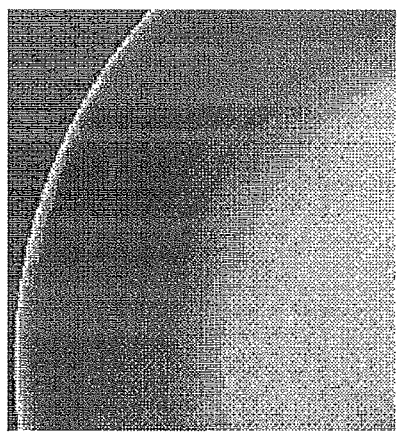
FIG. 8 is a photograph showing an example of the haze unevenness in an outer circumferential portion of a wafer after final polishing.

Defect % quantified by the foregoing method was 1.1% in case of the haze map of FIG. 7, and 5.2% in case of the haze unevenness of FIG. 8. To determine the haze unevenness of FIG. 8 as fail, criterion of Defect % was defined as follows: 5% or less is pass; more than 5% is fail.

In quality evaluation, micro defect was judged based on comparative example 1, described later. The micro defect largely varied and hence was shown as follows: less than 1.5 times as many as comparative example 1 is "good"; 1.5 times or more and less than 2 times is "moderate"; 2 times or more is "bad".

Table 1 shows conditions of the polishing agent and the polishing pad, and wafer quality after polishing in example 1, and examples 2 to 6 and comparative examples 1 to 8, described later. As shown in Table 1, the haze level was good, and the haze unevenness (Defect %) had a good value of 1.1%, which was significantly below a passing criterion of 5.0%. In addition, the result was also satisfactory for micro defect.

Example 2

A silicon wafer was polished as in example 1 except that the weight average molecular weight of hydroxyethyl cellulose in the polishing agent was changed to 400,000, and $D_1/D_2$ was changed to 1.51. The quality of the polished wafer was then evaluated.

Consequently, as shown in Table 1, the haze level was good, and the haze unevenness (Defect %) had a good value of 3.3%, which was below a passing criterion of 5.0%. In addition, the result was also satisfactory for micro defect.

Example 3

A silicon wafer was polished as in example 1 except that the weight average molecular weight of hydroxyethyl cellulose in the polishing agent was changed to 700,000, and $D_1/D_2$ was changed to 2.28. The quality of the polished wafer was then evaluated.

Consequently, as shown in Table 1, the haze level was good, and the haze unevenness (Defect %) had a good value of 2.9%, which was below a passing criterion of 5.0%. In addition, the result was also satisfactory for micro defect.

Example 4

A silicon wafer was polished as in example 1 except that the polishing pad was changed to the polishing pad A-3 shown in FIG. 5, i.e., the polishing pad exhibiting a contact angle of 62.8° 100 seconds after dropping pure water. The quality of the polished wafer was then evaluated.

Consequently, as shown in Table 1, the haze level was good, and the haze unevenness (Defect %) had a good value of 2.9%, which was below a passing criterion of 5.0%. In addition, the result was also satisfactory for micro defect.

Example 5

A silicon wafer was polished as in example 1 except that the polishing pad was changed to the polishing pad C shown in FIG. 5, i.e., the polishing pad exhibiting a contact angle of 63.9° 100 seconds after dropping pure water. The quality of the polished wafer was then evaluated.

Consequently, as shown in Table 1, the haze level was good, and the haze unevenness (Defect %) had a good value of 4.6%, which was below a passing criterion of 5.0%. In addition, the result was also satisfactory for micro defect.

Example 6

A silicon wafer was polished as in example 1 except that the polishing pad was changed to the polishing pad D shown in FIG. 5, i.e., the polishing pad exhibiting a contact angle of 81.9° 100 seconds after dropping pure water. The quality of the polished wafer was then evaluated.

Consequently, as shown in Table 1, the haze level was good, and the haze unevenness (Defect %) had a good value of 3.9%, which was below a passing criterion of 5.0%. In addition, the result was also satisfactory for micro defect.

Comparative Example 1

A silicon wafer was polished as in example 4 except that the average primary particle size of colloidal silica in the polishing agent was changed to 35 nm, and $D_1/D_2$ was changed to 2.28. The quality of the polished wafer was then evaluated.

Consequently, as shown in Table 1, since comparative example 1 had an average primary particle size of 35 nm, i.e., the average primary particle size was 30 nm or more, the average haze value was degraded to 0.0750 ppm. This result was higher than the examples by about 15%. This indicates that the average primary particle size should be less than 30 nm. However, if the particle size is too small, the polishing rate decreases. Thus, the average primary particle size should be 20 nm or more.

Comparative Example 2

A silicon wafer was polished as in example 4 except that the weight average molecular weight of hydroxyethyl cellulose in the polishing agent was changed to 300,000, and $D_1/D_2$ was changed to 1.51. The quality of the polished wafer was then evaluated.

Consequently, as shown in Table 1, since the weight average molecular weight of the hydroxyethyl cellulose was less than 400,000, a sufficient hydrophilicity could not be obtained, and the haze unevenness (Defect %) was 8.4%, which significantly exceeded a passing criterion of 5.0%.

Comparative Example 3

A silicon wafer was polished as in example 4 except that the weight average molecular weight of hydroxyethyl cellulose in the polishing agent was changed to 1,000,000, and $D_1/D_2$ was changed to 2.28. The quality of the polished wafer was then evaluated.

Consequently, as shown in Table 1, a sufficient hydrophilicity could be obtained, and the haze unevenness (Defect %) had a good value. However, since the weight average molecular weight of the hydroxyethyl cellulose was more than 700,000, aggregation of the colloidal silica in the polishing agent was promoted compared with the examples, micro defects were increased, and the result was judged as "bad".

Comparative Example 4

A silicon wafer was polished as in example 4 except that the weight average molecular weight of hydroxyethyl cellulose in the polishing agent was changed to 700,000, and $D_1/D_2$ was changed to 2.80. The quality of the polished wafer was then evaluated. In comparative example 4, $D_1/D_2$ was changed by adjusting the concentration of hydroxyethyl cellulose to be added.

Consequently, as shown in Table 1, since $D_1/D_2$ was more than 2.5, the haze unevenness (Defect %) was 5.5%, which exceeded a passing criterion of 5.0%.

Comparative Example 5

A silicon wafer was polished as in example 4 except that the weight average molecular weight of hydroxyethyl cellulose in the polishing agent was changed to 500,000, and $D_1/D_2$ was changed to 1.23. The quality of the polished wafer was then evaluated. Only in comparative example 5, a dispersing agent was added to decrease $D_1/D_2$. As the dispersing agent, a nonionic surfactant or an anionic surfactant can be used.

Consequently, as shown in Table 1, since $D_1/D_2$ was less than 1.5, a sufficient hydrophilicity could not be obtained, and the haze unevenness (Defect %) was 5.9%, which exceeded a passing criterion of 5.0%.

Comparative Example 6

A silicon wafer was polished as in example 1 except that the polishing pad was changed to the polishing pad A-1 shown in FIG. 5, i.e., the polishing pad exhibiting a contact angle of 0.0° 100 seconds after dropping pure water. The quality of the polished wafer was then evaluated.

Consequently, as shown in Table 1, since the polishing pad had an insufficient polishing-agent-holding property, the haze unevenness (Defect %) was degraded to 11.3%, which significantly exceeded a passing criterion of 5.0%.

Comparative Example 7

A silicon wafer was polished as in example 1 except that the polishing pad was changed to the polishing pad A-2 shown in FIG. 5, i.e., the polishing pad exhibiting a contact angle of 53.5° 100 seconds after dropping pure water. The quality of the polished wafer was then evaluated.

Consequently, as shown in Table 1, since the polishing pad had an insufficient polishing-agent-holding property, the haze unevenness (Defect %) was degraded to 5.2%, which exceeded a passing criterion of 5.0%.

Comparative Example 8

A silicon wafer was polished as in example 1 except that the polishing pad was changed to the polishing pad B shown in FIG. 5, i.e., the polishing pad exhibiting a contact angle of 40.8° 100 seconds after dropping pure water. The quality of the polished wafer was then evaluated.

Consequently, as shown in Table 1, since the polishing pad had an insufficient polishing-agent-holding property, the haze unevenness (Defect %) was degraded to 6.3%, which exceeded a passing criterion of 5.0%.

TABLE 1

| | Polishing agent | | | Polishing pad | | | Quality | | |
|---|---|---|---|---|---|---|---|---|---|
| | Primary particle size | HEC weight average molecular weight | D1/D2 | Contact angle [°] (100 sec after dropping) | Hardness (Shore A) | Seasoning | Haze (ppm) | Haze unevenness (Defect %) | Micro defect |
| Example 1 | 25 nm | 500,000 | 1.86 | 114.5 | 54.0 | 30 min | 0.0640 | 1.1% | good |
| Example 2 | 25 nm | 400,000 | 1.51 | 114.5 | 54.0 | 30 min | 0.0630 | 3.3% | good |
| Example 3 | 25 nm | 700,000 | 2.28 | 114.5 | 54.0 | 30 min | 0.0660 | 2.9% | good |
| Example 4 | 25 nm | 500,000 | 1.86 | 62.8 | 56.0 | 240 min | 0.0640 | 2.9% | good |
| Example 5 | 25 nm | 500,000 | 1.86 | 63.9 | 45.0 | 30 min | 0.0670 | 4.6% | good |
| Example 6 | 25 nm | 500,000 | 1.86 | 81.9 | 62.0 | 30 min | 0.0650 | 3.9% | good |
| Comparative example 1 | 35 nm | 500,000 | 2.28 | 62.8 | 56.0 | 240 min | 0.0750 | 3.1% | good |
| Comparative example 2 | 25 nm | 300,000 | 1.51 | 62.8 | 56.0 | 240 min | 0.0660 | 8.4% | good |
| Comparative example 3 | 25 nm | 1,000,000 | 2.28 | 62.8 | 56.0 | 240 min | 0.0640 | 0.7% | bad |
| Comparative example 4 | 25 nm | 700,000 | 2.80 | 62.8 | 56.0 | 240 min | 0.0660 | 5.5% | good |
| Comparative example 5 | 25 nm | 500,000 | 1.23 | 62.8 | 56.0 | 240 min | 0.0660 | 5.9% | good |
| Comparative example 6 | 25 nm | 500,000 | 1.86 | 0.0 | 56.0 | 30 min | 0.0650 | 11.3% | good |
| Comparative example 7 | 25 nm | 500,000 | 1.86 | 53.5 | 56.0 | 120 min | 0.0640 | 5.2% | good |
| Comparative example 8 | 25 nm | 500,000 | 1.86 | 40.8 | 50.0 | 30 min | 0.0680 | 6.3% | good |

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A final polishing method comprising bringing a silicon wafer into sliding contact with a polishing pad attached to a turn table while supplying a polishing agent to the polishing pad, wherein the polishing agent contains colloidal silica, ammonia, and hydroxyethyl cellulose, the colloidal silica has a primary particle size of 20 nm or more and less than 30 nm as measured by BET method, the hydroxyethyl cellulose has a weight average molecular weight of 400,000 to 700,000, the polishing agent satisfies $1.5 \leq D_1/D_2 \leq 2.5$ where $D_1$ is a particle size having a cumulative volume percentage of 95% of particles contained in the polishing agent as measured by dynamic light scattering or laser diffraction scattering, and $D_2$ is a particle size having a cumulative volume percentage of 95% of the colloidal silica in case of dispersing the colloidal silica in water with a concentration identical to a colloidal silica concentration in the polishing agent as measured by dynamic light scattering or laser diffraction scattering, and the polishing pad exhibits a contact angle of 60° or more with pure water, the contact angle being measured 100 seconds after dropping the pure water to the polishing pad that has been subjected to seasoning and then dried.

2. The final polishing method according to claim 1, wherein a time of the seasoning is 30 minutes.

* * * * *